(12) United States Patent
Hailes

(10) Patent No.: US 7,550,897 B2
(45) Date of Patent: Jun. 23, 2009

(54) ELECTRONIC DRIVE SYSTEM FOR A DROPLET SPRAY GENERATION DEVICE

(75) Inventor: Anthony Hailes, Hertfordshire (GB)

(73) Assignee: The Technology Partnership PLC, Melbourn, Hertfordshire (GB)

( * ) Notice: Subject to any disclaimer, the term of this patent is extended or adjusted under 35 U.S.C. 154(b) by 15 days.

(21) Appl. No.: 11/547,806

(22) PCT Filed: Apr. 6, 2005

(86) PCT No.: PCT/GB2005/001317

§ 371 (c)(1),
(2), (4) Date: Oct. 6, 2006

(87) PCT Pub. No.: WO2005/097348

PCT Pub. Date: Oct. 20, 2005

(65) Prior Publication Data

US 2007/0176958 A1    Aug. 2, 2007

(51) Int. Cl.
*H01L 41/09* (2006.01)
*H02N 2/06* (2006.01)

(52) U.S. Cl. .................. 310/317; 310/316.03
(58) Field of Classification Search ............... 310/317, 310/314, 316.01, 316.03
See application file for complete search history.

(56) References Cited

U.S. PATENT DOCUMENTS

| | | | |
|---|---|---|---|
| 4,525,790 A | 6/1985 | Nakamura | |
| 6,016,052 A * | 1/2000 | Vaughn | 323/355 |
| 2002/0129813 A1* | 9/2002 | Litherland et al. | 128/200.16 |
| 2005/0279851 A1* | 12/2005 | Ivri | 239/4 |
| 2007/0159422 A1* | 7/2007 | Blandino et al. | 345/82 |

FOREIGN PATENT DOCUMENTS

EP    A-0165470    12/1985

* cited by examiner

Primary Examiner—Quyen Leung
Assistant Examiner—Derek J Rosenau

(57) ABSTRACT

An electronic drive system for a droplet spay generation device of the type having a droplet generator including a perforate membrane driven by a piezoelectric transducer, the electronic drive system comprising: a programmable microcontroller providing a power supply for converting, in use, a battery supply voltage to power the device; a power amplifier connected to receive electric power from the power supply and supply a drive signal to the piezoelectric generator in use; and wherein the micro-controller is also arranged: to control the operation of the power amplifier, including the drive signal operating frequency at substantially its resonant frequency; to measure the current provided to the power amplifier by the power supply at a plurality of different frequencies; to determine, as the resonant frequency of the droplet generator, the frequency at which the maximum power is consumed by the amplifier, and to set the drive signal operating frequency at the resonant frequency.

7 Claims, 1 Drawing Sheet

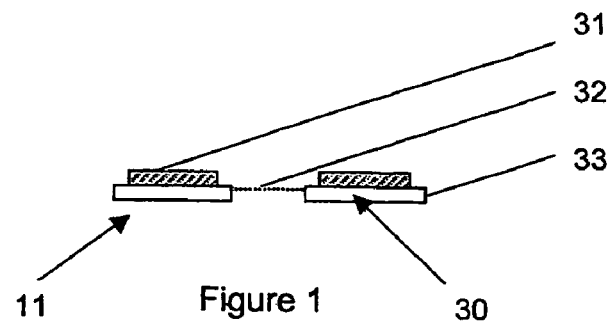
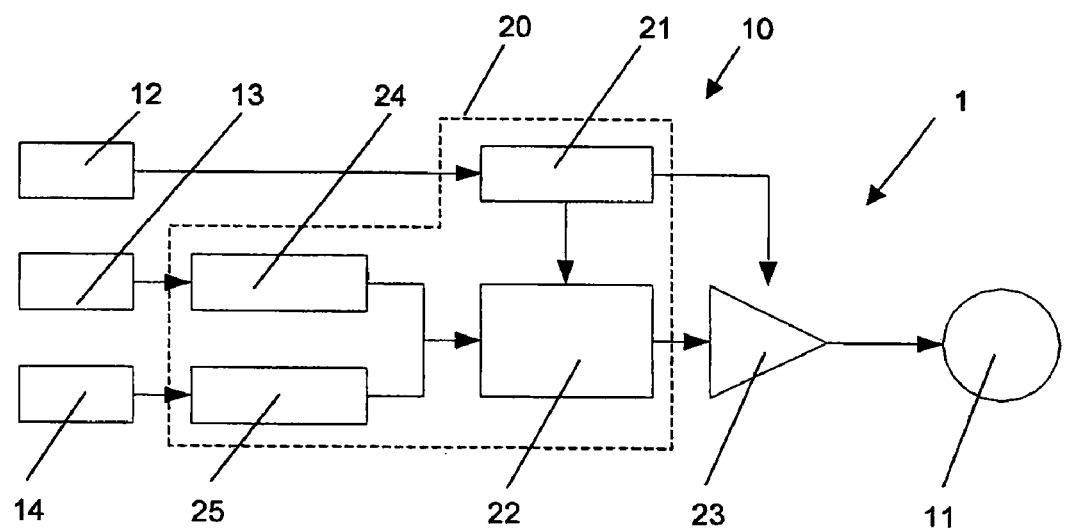
Figure 1
Figure 2

ELECTRONIC DRIVE SYSTEM FOR A DROPLET SPRAY GENERATION DEVICE

BACKGROUND OF THE INVENTION

The present invention relates to an electronic drive system for droplet spray generation and, more particularly to an electronic drive system for use in a droplet spay generator for an air-freshening device.

An aim of the present invention is to provide a low cost electronic drive system for a droplet generator using a micro-controller to implement signal generation and timing elements of a circuit to drive the droplet generator.

SUMMARY OF THE INVENTION

Spray generators of the general type to which the present invention relates may, for example, be of the type described in EP-A-0615470.

According to the present invention, there is provided an electronic drive system for a droplet spray generation device of the type having a droplet generator including a perforate membrane driven by a piezoelectric transducer, the electronic drive system comprising:

a programmable micro-controller providing a power supply for converting, in use, a battery supply voltage to power the device, a power amplifier connected to receive electric power from the power supply and supply a drive signal to the piezoelectric generator in use; and wherein the micro-controller is also arranged to control the operation of the power amplifier, including the drive signal operating frequency at substantially its resonant frequency, to measure the current provided to the power amplifier by the power supply at a plurality of different frequencies, to determine, as the resonant frequency of the droplet generator, the frequency at which the maximum power is consumed by the amplifier, and to set the drive signal operating frequency at the resonant frequency.

By using a micro-controller the components of the present invention cost less than the expected cost of a device using a custom application specific integrated circuit (ASIC) providing the same functionality.

The power amplifier preferably comprises a resonant bridge circuit and the micro-controller outputs in use a pair of signals in anti-phase to the resonant bridge circuit to control the amplifier.

The drive system may be used to power and control a droplet generator for an air freshening device, in which case, preferably, the electronic drive system includes a multi-position switch connected to the micro-controller to control a timer provided by the micro-controller to set the interval at which the drive signal is provided to the power amplifier to control the interval at which the droplet generator is automatically operated.

The micro-controller may also provide a second timer to generate the drive signal, on demand, as a plurality of pulses of fixed interval over a predetermined period shorter than the interval at which the droplet generator is automatically operated, the second timer being operated by a mono-stable switch connected to the micro-controller.

The power supply is preferably provided by the micro-controller using an integrated pulse frequency mode.

By using a micro-controller device and using just a single pin to interrogate the multi position and, mono-stable switches a micro-controller with only six I/O pins may be used.

The power available from batteries is maximised by using the micro-controller's "sleep" mode, but waking it up under the control of a timed "watchdog" interrupt and whenever the mono-stable switch is pressed.

BRIEF DESCRIPTION OF THE DRAWINGS

An example of the droplet spray generation device incorporating a drive system according to the invention will now be described with reference to the accompanying drawings in which:

FIG. 1 illustrates a cross-sectional view of part of the droplet generator; and FIG. 2 is a block diagram of the drive system for the device.

DETAILED DESCRIPTION OF THE INVENTION

FIG. 1 shows part of a spray head 11 for an air-freshening device 1 used for spraying air-freshening fluid into a room. The spray head 11 includes a perforate membrane 32 coupled to a transducer 30 formed by an annular piezoelectric element 31 mounted on a substrate 33. Such devices are well-known in the art. When the transducer is activated, air-freshening fluid is sprayed from a reservoir (not shown) through the perforate membrane 32 to the outside environment within the room.

The block diagram of FIG. 2 shows an electronic drive system 10 connected to the spray head 11, the drive system incorporating a micro-controller 20 (described in more detail below) and the device being powered by two "AA" alkaline batteries 12 providing in the range of 2-3.2 volts.

In an air-freshener of this type, there may be a requirement that the device 1 sprays fluid through the spray head 11 in two different modes. A background mode is provided wherein a preset quantity of fluid is emitted by the spray head 11 at intervals determined by a user. This is achieved by automatically actuating the 35 piezoelectric transducer for a predetermined length of time, a slide switch 13 allowing the user to control how often the spray head 11 emits fluid. The slide switch 13 is a five-position slide switch that the user may adjust to set the time interval between background sprays.

A boost mode is also provided; in this mode, when the user operates push switch 14 the spray head sprays a preset quantity of fluid. Typically, the background spray emits a maximum of 400 mg of fluid per day and the boost mode emits 10 mg of fluid in 10 seconds on activation of the push switch 14.

Micro-controller 20 is, for example, an Atmel "ATTINY13" or "ATTINY26L" device. These devices contain all of the functional blocks required to implement the features described herein. The micro-controller 20 has six I/O pins.

The air-freshening device 1 is constructed to be power efficient and the micro-controller 20 contains a number of features to achieve this. A power supply unit 21 is provided on the micro-controller to provide power for the components on the micro-controller 20 and to the spray head 11. This includes a DC-to-DC converter integrated circuit together with the inductor, diode and capacitors it requires to operate. It can supply 5 volts at up to 200 mA from the two "AA" cells 12. It has very low quiescent power consumption when not under load, and its load current can be estimated by measuring its average switching frequency (as described below). The power supply circuit uses an integrated "pulse frequency mode" dc-to-dc converter integrated circuit to provide the stabilised 5-volt, 0.2 amp power rail. To minimise power consumption, the microprocessor is kept in "sleep" mode when not spraying.

A power amplifier circuit 23 provides a drive signal to the spray head 11. In this example, the amplifier circuit is configured as a resonant bridge circuit. It requires two digital drive signals in anti-phase at a desired frequency. Operating from the 5-volt power supply, it can generate a drive signal of the order of 32 volts peak-to-peak. A series capacitance of the spray head 11 forms part of the resonant bridge power amplifier circuit.

The background timer 24 is used to set the time interval between the "background" sprays as mentioned above. It also sets the time duration of each spray. The timer 24 is provided by software on the micro-controller 20. The slide switch 13 is connected to the background timer 24 to allow the user to set the interval between each background spray.

A boost timer 25 is also provided as software on the microcontroller 20. When the push switch 14 is pressed, the software executes the boost spray. It splits the fluid to be sprayed into a number of "quanta" of fixed length, with a fixed time interval between each. Each quanta is 1 second, which is repeated 10 times with a 200 ms time gap between each pulse. The 200 ms gap lowers the average flow rate and gives the spray head 11 time to recover between each spray.

The micro-controller 20 has a stable 9.6 MHz internal frequency source that is used to generate square wave drive signals at the frequencies required, and with the frequency resolution required to drive the spray head 11. By adjusting the number of CPU dock cycles between output transitions, frequency generator software 22 can generate square waves in the range of 75-90 KHz (which is required for the spry head 11), with a resolution of the order of 1 KHz. Since every other frequency step is an odd number of dock cycles, the duty cycle of the square wave generated is only approximately 50% in these cases. In addition, the micro-controller 20 is programmed to generate dual signals in anti-phase, overlapping by one clock cycle. These overlapping drive signals are required for the resonant bridge circuit 23 that drives the spray head 11.

The spray head 11 operates best at its resonant frequency which is in the range of 75-90 KHz and requires a drive voltage in the order of 32 volts peak-to peak at this frequency. When driven at this frequency, the power consumption of the transducer is at a maximum. To determine this resonant frequency, the current supplied by the power supply 21 can be measured by counting the falling edges on its switching output. Comparator input and edge detector circuits in the micro-controller 20 are used to monitor the occurrence of these edges. A measurement of the power supply current is taken at each frequency step in the 75-90 KHz range, and the frequency at which the maximum current is consumed is recorded. It has been found that 6 millisecond test sprays with 6 millisecond gaps between them give an accurate measurement of the resonant frequency. The frequency generator 22 selects the operating frequency that places the highest load on the power supply 21 to be the resonant frequency, and this is then used in further operation to drive the spray head 11.

The system has two calibration modes: When the system is switched on, the resonant frequency is unknown. So, before spraying, all frequencies in the range are tested as described above to find the operating frequency of the spray head 11. A full calibration measurement such as this makes an audible sound. When operating, the resonant frequency may appear to shift, due to variation of circuit parameters with temperature, etc. Therefore, each time the system sprays, a single frequency point is measured. When all frequencies in the range have been measured, the operating frequency value is updated, and the process restarts. The sound made by such a single point measurement is virtually inaudible due the calibration update being over many background sprays.

A problem solved by use of the boost function is the deleterious influence on device performance of a static layer of fluid which, in some circumstance may develop over time on the top surface of the spray head 11. On some devices it appears that the spray head 11 has difficulty producing droplets through this film of fluid. It was noticed that the initiation of spraying can move the fluid film away from the spraying area. Thus it was determined that a spray head 11 suffering from this problem could be cleared by subjecting it to successive initiation operations. The boost function of the device of this example thus consists of 10 off 1 s pulses with 200 ms pauses between each, rather than a single 10 s pulse.

The invention claimed is:

1. An electronic drive system for a droplet spray generation device of the type having a droplet generator including a perforate membrane driven by a piezoelectric transducer, the electronic drive system comprising:
    a drive circuit including a programmable micro-controller and a power supply for converting, in use, a battery supply voltage to power the device,
    a power amplifier connected to receive electric power from the power supply and supply a drive signal to the piezoelectric generator in use, the power amplifier comprising a resonant bridge circuit; and
    wherein the micro-controller is connected to the power amplifier and outputs, in use, a pair of signals in anti-phase to the resonant bridge circuit to control the operation of the power amplifier, including the drive signal operating frequency at substantially its resonant frequency,
    and wherein the micro-controller is arranged
        to measure the current provided to the power amplifier by the power supply at a plurality of different input frequencies,
        to determine, as the resonant frequency of the droplet generator, the frequency of such different input frequencies at which the maximum power is consumed by the amplifier, and
        to set the drive signal operating frequency at the resonant frequency.

2. An electronic drive system according to claim 1, wherein the electronic drive system includes a multi-position switch connected to the micro-controller to control a timer provided by the micro-controller to set the interval at which the drive signal is provided to the power amplifier to control the interval at which the droplet generator is automatically operated.

3. An electronic drive system according to claim 2, wherein the micro-controller provides a second timer to generate the drive signal, on demand, as a plurality of pulses of fixed interval over a predetermined period shorter than the interval at which the droplet generator is automatically operated, the second timer being operated by a mono-stable switch connected to the micro-controller.

4. An electronic drive system according to claim 1, wherein the power supply is provided by the micro-controller using an integrated pulse frequency mode.

5. A spray generation device having an electronic drive system according to claim 1.

6. An air freshener having a spray generation device according to claim 5.

7. An electronic drive system for a droplet spray generation device of the type having a droplet generator including a perforate membrane driven by a piezoelectric transducer, the electronic drive system comprising:

a drive circuit including a programmable micro-controller and a power supply for producing power for the device, a power amplifier circuit responsively connected to the power supply to supply a drive signal to the droplet generator, the power amplifier comprising a resonant bridge circuit;

the programmable micro-controller responsively coupled to the power amplifier to (a) measure the current provided to the power amplifier by the power supply when, in use, the droplet generator is operated at a plurality of different input frequencies, (b) determine as the resonant frequency of the droplet generator, the frequency of such input frequencies at which the maximum power is consumed by the amplifier, and (c) set a drive signal operating frequency at the resonant frequency, to operate the droplet generator at its optimum operating frequency.

* * * * *